United States Patent [19]

Karp et al.

[11] 4,025,907
[45] May 24, 1977

[54] INTERLACED MEMORY MATRIX ARRAY HAVING SINGLE TRANSISTOR CELLS

[75] Inventors: Joel Allen Karp, Palo Alto; John Anthony Reed, Los Altos, both of Calif.

[73] Assignee: Burroughs Corporation, Detroit, Mich.

[22] Filed: July 10, 1975

[21] Appl. No.: 594,669

[52] U.S. Cl. .................. 340/173 CA; 307/238; 340/173 R; 340/173 FF; 357/45; 357/24
[51] Int. Cl.² .................................. G11C 13/00
[58] Field of Search ... 340/173 R, 173 CA, 173 FF; 307/238; 357/45, 24

[56] References Cited

UNITED STATES PATENTS

| | | | |
|---|---|---|---|
| 3,771,148 | 11/1973 | Aneshansley | 340/173 CA |
| 3,838,295 | 9/1974 | Lindell | 307/238 |
| 3,852,800 | 12/1974 | Ohwada et al. | 340/173 CA |
| 3,953,839 | 4/1976 | Dennison et al. | 340/173 R |

*Primary Examiner*—David L. Trafton
*Attorney, Agent, or Firm*—Mervyn L. Young; Kevin R. Peterson

[57] ABSTRACT

This disclosure relates to memory array organization of single transistor cells and the differential sense amplifiers provided therewith. To accommodate the differential sense amplifiers, the array is laid out in rows and functional columns where a functional column consists of a pair of columns such that odd row cells are connected to the odd column of the pair and even row cells are connected to the even column of the pair. A differential sense amplifier is then provided for each pair of odd and even columns which are inherently balanced at the sense amplifier terminals. Single ended or edge ended I/O circuitry is provided with direct access to the respective pairs of columns.

6 Claims, 5 Drawing Figures

INTERLACED MEMORY MATRIX ARRAY HAVING SINGLE TRANSISTOR CELLS

RELATED U.S. PATENT APPLICATIONS

U.S. Patent applications directly or indirectly related to the subject application are the following:

Ser. No. 594,579 filed July 10, 1975, by J. A. Reed et al and entitled "An Ultra High Sensitivity Sense Amplifier for Memories Employing Single Transistor Cells."

BACKGROUND OF THE INVENTION

1. Field of the Invention

This invention relates to an integrated circuit memory array, and more particularly to such an array wherein each individual memory cell is formed of a single transistor and a capacitive storage unit, the combination being referred to as a "single transistor cell."

2. Description of Prior Art

Many types of integrated circuit memories employing single transistor cells exist in the prior art. The advantage of single transistor cells is that less space per cell is required on an integrated circuit chip with the resultant higher packing density. A disadvantage of single transistor cells is that their charge must be restored or refreshed. Static memories which do not require a charge restore may be formed of memory cells each employing two or more transistors to form a latch. However, as the number of transistors per cell increases, a greater area is required for each cell with a resultant decrease in the cell packing density. A principal advantage of integrated circuitry formed on a semiconductor chip is that once the fabrication process has been developed, highly reliable circuits can be manufactured in volume to achieve an economy of scale. Thus, as the packing density of the circuit design increases, the manufacture of the resultant circuits becomes more economical.

The term "single transistor cell" is employed to mean a memory cell for storing a 0 or 1 binary bit of information, which cell employs no more than one transistor and also a capacitance. As was indicated above, single transistor cells have been employed in integrated circuit memories in order to achieve a higher cell packing density. The integrated circuit device may be a bipolar device; however, in the present invention, it is preferably an MOS device employing field effect transistors. An MOS (a metal-oxide semiconductor) device is a field effect transistor in which the silicon dioxide acts as a dielectric insulator between a gate contact metal and a substrate silicon channel. A field effect transistor, FET, is a solid-state device in which current is controlled between a source terminal and a drain terminal by a voltage applied to a nonconducting gate terminal.

Prior art disclosures of single transistor cells are contained, for example, in the Christensen, U.S. Pat. No. 3,588,844; Stein et al, U.S. Pat. No. 3,774,176; and Markowitz, U.S. Pat. No. 3,789,371.

The state of the art in integrated circuit memories has long been such that 1,024 bit cells could be placed on a single integrated circuit chip. In fact, the state of the art of integrated circuit technology is such that 4,096 bit cells can now be placed on an integrated circuit chip. However, to significantly increase the number of bit cells placed on an integrated circuit chip, certain problems must be overcome. The present invention is designed to provide an integrated circuit memory with 16,384 bit cells or more on an integrated circuit chip.

In the layout of memory circuits, consideration is to be given to the relation of the sense amplifiers to the various cells of the array. In one type of sensing arrangement, the respective sense amplifiers are placed in the middle of the array to service memory cells located in columns on both sides of the respective sense amplifiers. This provides an inherent differential balance with the result that signals of very small amplitude can be detected. This is particularly advantageous with single transistor cell memories. However, such a centered sensing method must be provided with compensation for capacitance imbalance. As distinct from the centered sensing method, sense amplifiers may be placed at one edge of the array with the cell accessing circuitry placed at the other edge of the array.

While differential sensing is required for signals of small amplitudes, physically locating sense amplifiers in the center of memory array becomes impractical when the number of cells in the array becomes increasingly large. It is desirable, then, to provide a large memory array with sense amplifiers located at one edge of the array which amplifiers nonetheless provide differential sensing and a completely balanced operation.

It is an object of the present invention to provide an improved and enlarged memory array on a single integrated circuit chip.

It is another object of present invention to provide an improved memory array the size of which can be increased without redesign of the array.

It is still another object of present invention to provide an improved and an enlarged memory array having sense amplifiers for differential sensing and balanced operation.

SUMMARY OF THE INVENTION

In order to achieve the above described objects, the present invention resides in a memory array organization of single transistor cells and the differential sense amplifiers provided therewith. To accommodate the differential sense amplifiers, the array is laid out in rows and functional columns where a functional column consists of a pair of columns such that odd row cells are connected to the odd column of the pair and even row cells are connected to the even column of the pair. A differential sense amplifier is then provided for each pair of odd and even columns which are inherently balanced at the sense amplifier terminals. Single ended or edge ended I/O circuitry is provided with direct access to the respective pairs of columns.

Each of the sense amplifiers is formed of a cross coupled latch connected to the respective columns by source followers and leads from the latch drive write back gates coupled to the respective columns which conditionally restore a zero level of a cell.

A feature, then, of the present invention resides in an integrated circuit memory comprising an array of memory cells arranged in rows and columns, and provided with pairs of column buses wherein odd row cells of the array are coupled to the odd column bus of the pair and even row cells are coupled to the even column bus of the pair so as to provide an inherently balanced system at the terminals of the sense amplifiers provided for each pair of column buses.

A particular feature of the present invention resides in such a memory array wherein the individual cells of the array are comprised of a single transistor and an associated capacitance.

BRIEF DESCRIPTION OF THE DRAWINGS

The above objects, advantages and features of the present invention will become more readily apparent from a review of the following specification when taken in conjunction with the drawings wherein.

GENERAL DESCRIPTION OF THE INVENTION

Figure 1:
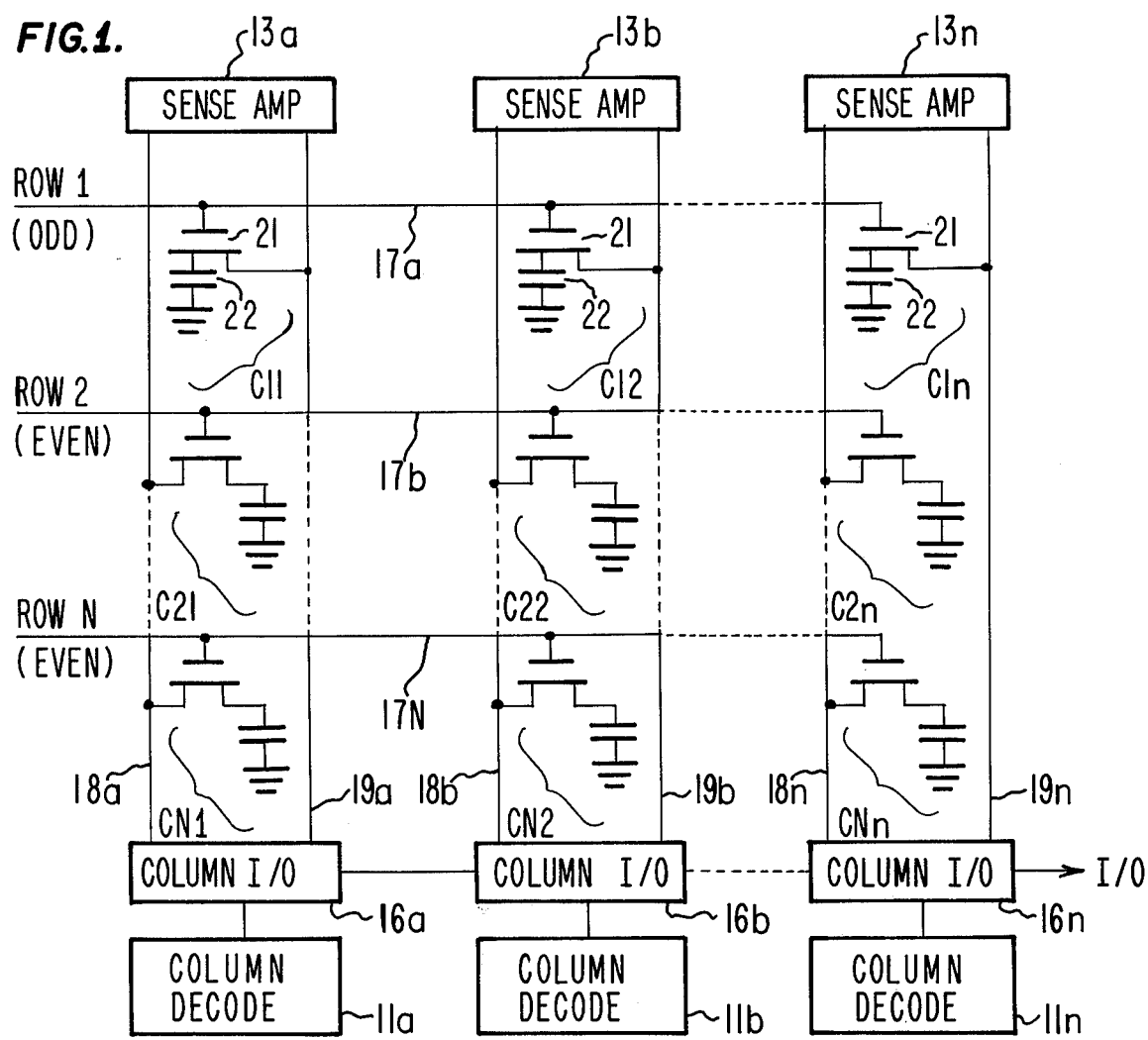
FIG. 1 is a schematic diagram of the array organization of the present invention.
Figure 2:
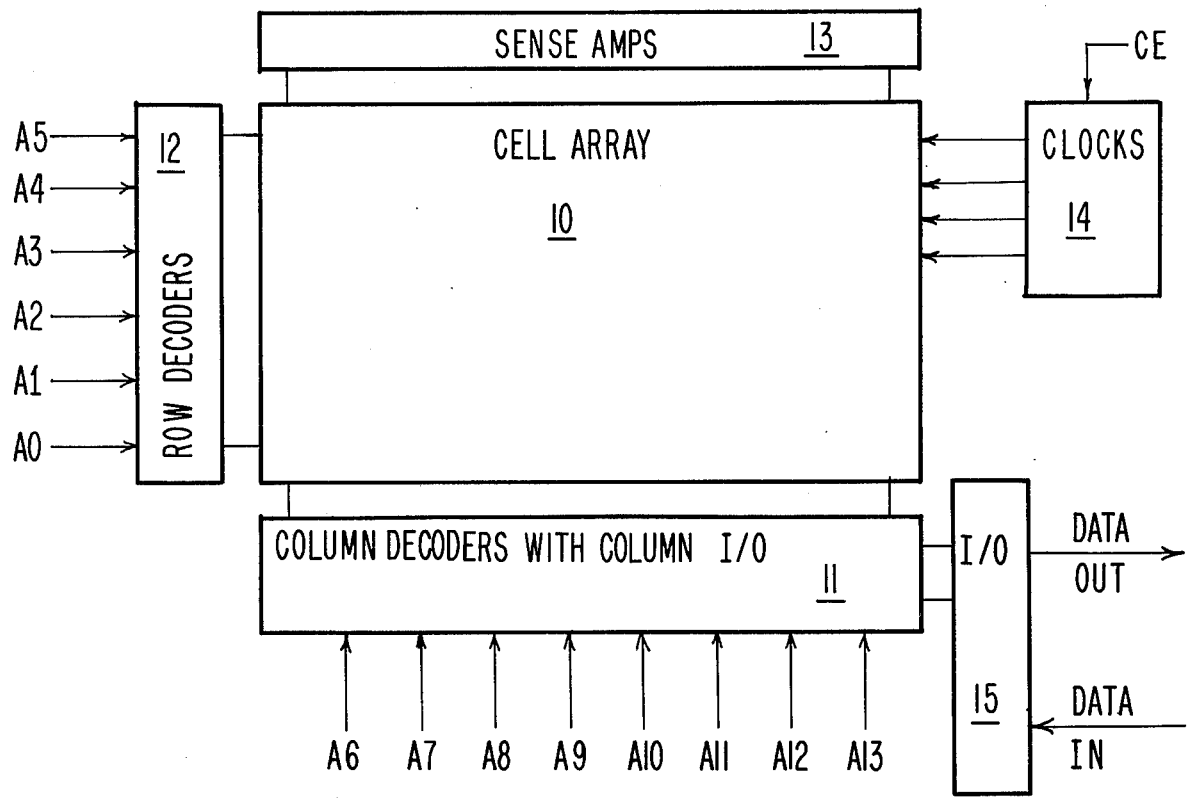
FIG. 2 is a block diagram of the memory system of the present invention.

As was indicated above, an object of the present invention is to provide an enlarged memory array which nonetheless accommodates differential sensing by sense amplifiers located at one edge of the array. A memory array organization designed to this end is shown in FIG. 1. As illustrated therein, the array is formed of a plurality of memory cells Cll, ..., CN$n$ which are arranged in a matrix of $n$ columns and $N$ rows. Each cell is formed of a capacitance 22 which is charged and discharged by way of field effect transistor 21. Transistor 21 of each cell is coupled to one of the row select lines 17$a$, ..., 17N and also to either one of column select lines 18$a$, ..., 18$n$ if the corresponding cell resides in an even numbered row or to one of column select lines 19$a$, ..., 19$n$ if the corresponding cell resides in an odd numbered row. In this manner, each column line of the respective pairs of column lines 18, 19 will be connected to the same number of memory cells so as to provide a balanced pair of lines with equal capacitance and starting potentials. Each pair of column lines is then coupled to the terminals of a respective differential sense amplifier 13$a$, ..., 13$n$. To complete the circuitry of the FIG. 1, each pair of column lines 18, 19 is coupled at its opposite end to one of the Column I/O data exchanges 16$a$, ..., 16$n$ and to a respective column decode unit 11$a$, ..., 11$n$. The overall memory arrangement is illustrated in FIG. 2 and, in addition to the cell array 10, described in detail above, includes sense amplifiers 13, column decoders 11 with column I/O 16, row decoders 12 and clock unit 14. Data exchange to and from memory array 10 is by way of the I/O unit 15.

The memory array so far described provides a number of advantages. For example, the autonomy of the sense amplifiers and the I/O circuitry allows the design of extremely sensitive sense amplifiers which can be laid out with nearly perfectly balanced topology. Also, the cell aspect ratio achieved by this organization allows very coefficient design of the periphery circuitry thus minimizing overall chip size.

Not only is the memory array adapted for differential sense amplfiers, but the individual amplifiers are also adapted to the memory array. Previous differential latch type sense amplifiers have encountered problems associated with capacitive imbalances at low impedance levels and long write recovery times and high power dissipation. The length of the write recovery times is caused by having to force a diffused column bus through the relative high impedance of the load devices where a positive going clock signal is required for the restore operation. The present invention not only avoids such problems, but also provides an efficient design of densely packed arrays of single transistor cells as has been discussed above.

Figure 3:
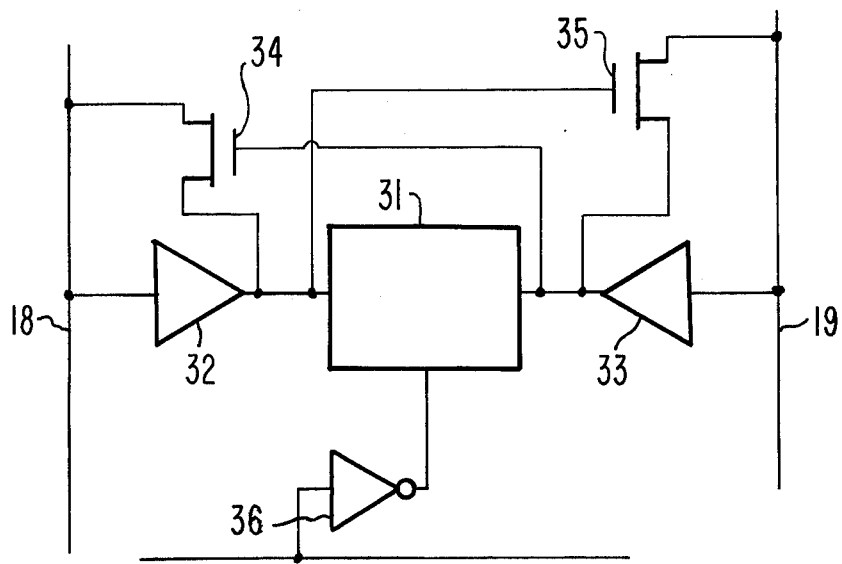
FIG. 3 is a block diagram of a sense amplifier as employed in the present invention.

A generalized diagram of the sense amplifier of the present invention is illustrated in FIG. 3. As disclosed therein, the amplifier includes a cross coupled latch 31 that resides between even column bus 18 and odd column bus 19 which are coupled to latch 31 by source followers 32 and 33 respectively. In order to restore the various memory cells of a particular column, even column bus 18 is driven by write back gate 34 and odd column bus 19 is driven by write back gate 35. A clock signal is supplied to latch 31 by way of inverter 36.

Both of the column buses 18 and 19 are initially precharged and balanced. If a zero is stored in a particular cell, the column bus that is selected (via the even or odd row select line, as was discussed above) will be discharged to 0 volts by the action of a positive going clock signal supplied to the amplifier by way of clock inverter 36 of FIG 3. If a one was stored in the accessed cell, the respective column bus will remain charged. In this manner, the cell information is refreshed upon each rise of the clock signal.

The sense amplifier has no effect on a stored 1. Such data is totally restored by the mere act of connecting the cell to the bus (i.e., in FIG. 1, selecting row 1 will cause the voltage on C22 to equalize with that on bus 19$a$, whether C22 was charged or not). The sense amplifier, discerning the polarity of the small difference that does develop due to the finite capacitance ratio, functions only to discharge to 0 bus 18 or 19, whichever it deems to be lower in potential.

In prior art, particularly low impedance latches, both buses 18 and 19 are significantly reduced in level initially by the action of the sensing clock, and thus the higher of the two buses must be conditionally recharged. This results in a power/speed tradeoff (that is, quick recharge and quick write recovery times can be had only at the expense of additional power) which is not generic to the present invention.

Moreover, the edge sensing arrangement allows direct access to each addressed cell for writing, whereas in the prior art using edge accessed, center sensed arrays, it is the task of the sense amplifier to invert and retransmit data intended for that half of the array not directly connected to the edge access circuitry.

DETAILED DESCRIPTION OF THE INVENTION

Figure 4:
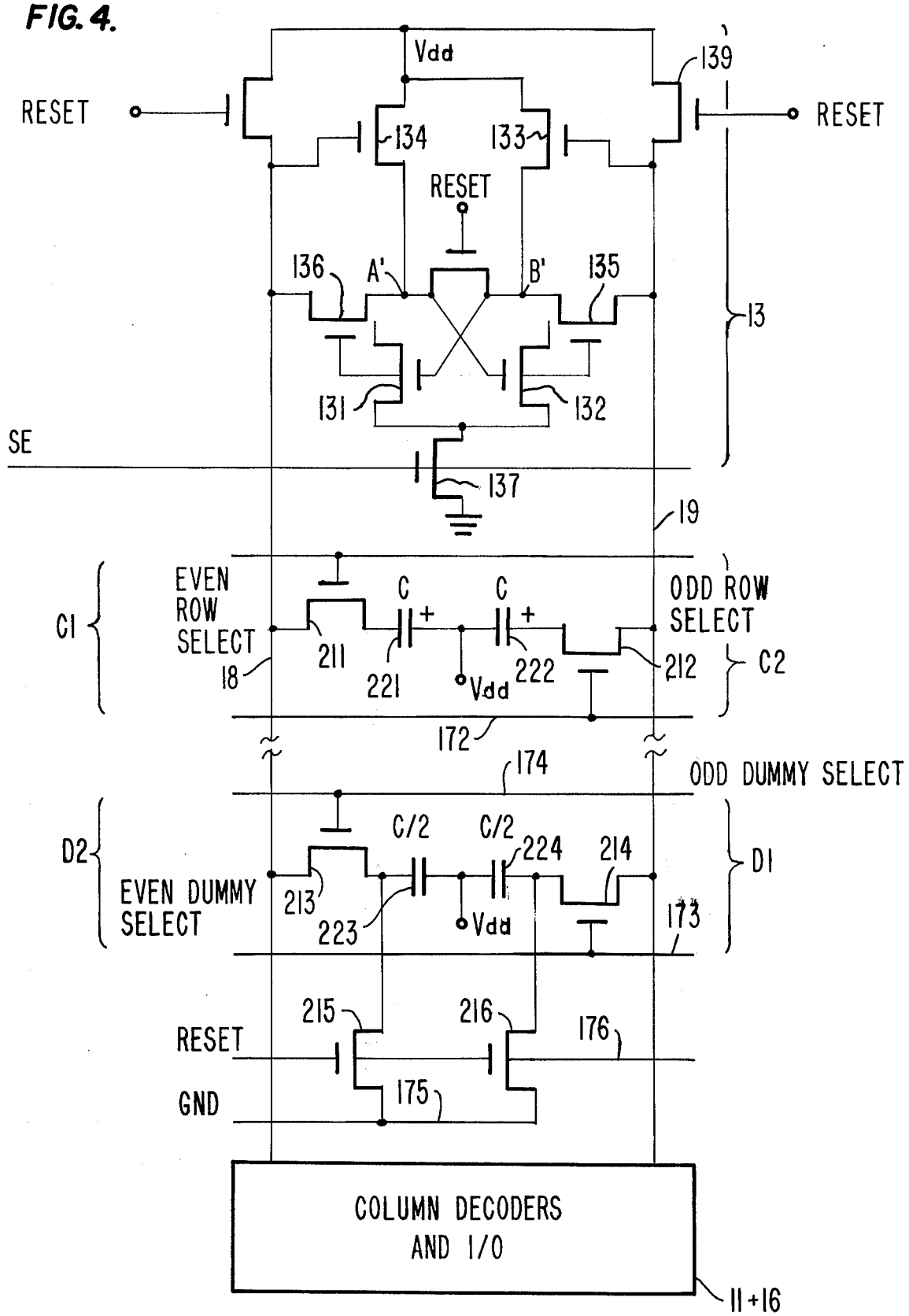
FIG. 4 is a detailed schematic diagram of the sense amplifier of the present invention and its connection to the memory array.

A more detailed illustration of the various aspects of the present invention is illustrated in FIG. 4. As shown therein, the column 1/0 unit 16 is coupled by way of a pair of column buses 18 and 19 to sense amplifier 13, two memory cells C1 and C2, and dummy cells D1 and D2. The purpose of dummy cells D1 and D2 is to maintain load balance on the column buses when one or the other of those column buses is activated due to a memory access. It will be remembered that only an odd or even column bus, but not both, will be employed during each memory access cycle.

Even storage cell C1 and odd storage cell C2 are the same as the respective odd and even storage cells that were described in relation to FIG. 1. Storage cell C1 is comprised of capacitor 221 which is charged or discharged to even column bus 18 by way of field effect transistor 211 which is activated by signals on even row select line 171. Similarly, odd storage cell C2 is comprised of capacitor 222 which is charged or discharged from odd column bus 19 by way of field effect transistor 212 and is activated by signals on odd row select line 172. The only difference between two storage cells of FIG. 4 and corresponding storage cells of FIG. 1 is that the common sides of capacitors 221 and 222 are connected to a constant voltage source Vdd rather than being grounded.

As indicated in FIG. 4, a pair of dummy cells D1 and D2 are provided for each pair of odd and even cloumn buses, that is to say for each column of memory cells. Dummy cell D1 is comprised of capacitor 224 which is coupled to odd column bus 19 by way of field effect transistor 214 and is in turn activated by even dummy select line 173.

Dummy cell D2 comprises capacitor 223 which is coupled to even column bus 18 by field effect transistor 213 that is activated by signals from odd dummy select line 174. Capacitances 223 and 224 have their common side connected to a constant voltage source Vdd and each has a capacitance that is one half the capacitance of the individual capacitors 221 and 222 of the respective storage cells C1 and C2.

It will be noted from the above description that the dummy cell D1 is charged or discharged to odd column bus 19 by even dummy line 173 at the same time that even storage cell C1 is discharged to even column bus 18 by a signal on even row select line 171. Conversely, dummy cell D2 is charged or discharged to even column bus 18 by odd dummy line 174 at the same time that odd storage cell C2 is charged or discharged to odd column bus 19. The dummy cells act as a reference setter and, in this manner, provide a balanced pair of odd and even column buses to differential sense amplifier 13. The dummy cells D1 and D2 are reset each cycle by reset signals supplied to field effect transistors 215 and 216 respectively.

Sense amplifier 13 is illustrated in detail in FIG. 4 and comprises a cross coupled latch formed of field effect transistors 131 and 132. Input signals to the latch are received either from even column bus 18 or odd column bus 19 by way of field effect transistors 134 or 133 respectively which transistors act as source followers. This cascade coupling provides for higher gain of the amplifier. Output signals from the latch are amplified by either write back transistor 136 or write back transistor 135 to respectively drive either even column bus 18 or odd column bus 19. As indicated above, it is this write back feature which serves to restore the individual storage cells.

The latch is initially precharged by reset transistor 138 and is driven by a positive going clock signal SE supplied from transistor 137, it being remembered that all transistors are field effect transistors. Similarly, even column bus 18 and odd column bus 19 are precharged respectively by transistors 140 and 139. In a conventional amplifier, field effect transistors 134 and 133 would be gated by a restore clock signal and column buses 18 and 19 would be connected to nodes A' and B' respectively; however, in the sense amplifier of the present invention, they are coupled to the respective sense lines or column buses.

Figure 5:
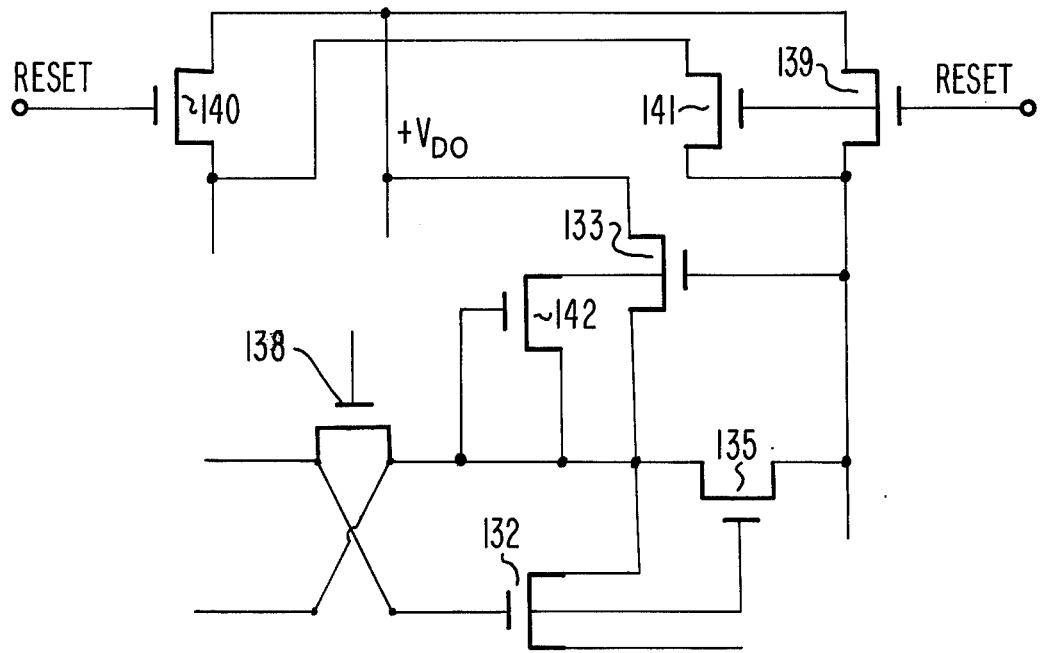
FIG. 5 is a modified schematic diagram of the amplifier of FIG. 4.

A modification of the amplifier of FIG. 4 is shown in FIG. 5. In this modification, the reset signal is also supplied to field effect transistor 141 and hence equalizes the initial potentials on even column bus 18 and odd column bus 19. Transistor 142 is provided to facilitate writing. It will be understood that the circuit is to be completed so as to be symmetrical with a similar reset signal being applied across even column bus 18 and circuit node A' of FIG. 4. This provides a high impedance regenerative amplifier which is accommodated by the interleaved cell array. As has been indicated above, the respective circuit nodes A' and B' are disconnected from the sense lines or column buses which in turn are very low capacitance lines. In this manner, a decision as to the polarity of the stored data can be made very quickly.

The topology of the circuit design provides low capacitances for the column buses so as to accommodate a maximized ratio of individual cell storage capacitance to the column bus capacitance. This ratio can be further maximized by the selection of the fabrication process so as to increase the cell storage capacitance. The fabrication process employed with the present invention is really outside the scope of the present invention and will not be discussed in detail. General comments on MOS fabrication processes can be found, for example, in *MOS Integrated Circuits*, Van Nostrand Reinhold Company (1972). However, some specific comments on the fabrication of the capacitors in individual memory cells will now be made.

Metal-oxide-semiconductor (MOS) devices may be considered as a subclass of the more general class of metal-insulator-semiconductor (MIS) structures. In general, in the design of MIS circuits, device gain and load capacitances are more or less fixed by physical limitations imposed in order to obtain a high packing density. Performance characteristics of the MIS circuit can be improved if the total load capacitance of the circuit is reduced.

While it is desirable to reduce the individual cell sizes as much as possible in order to achieve higher packing density, there is a limitation to some minimum cell size below which the capacitive loading of the cell reduces the voltage swing to a point at which detection cannot be made. The signal voltage from the cell is proportional to the ratio of the cell storage capacitance to the sum of that storage capacitance and the junction capacitance. Junction capacitance can be reduced as described in the Gosney et al, U.S. Pat. No. 3,825,119.

Fabrication processes can also be created to improve storage capacitance of the MIS cell. With the improvement of the storage capacitance by a selected fabrication process and the reduced load capacitance acheived by the topology of the present invention, an integrated circuit memory can be developed which has an extremely high cell packing density.

EPILOGUE

As thus disclosed, a memory array organization of single transistor cells is provided with differential sense amplifiers at one edge of the array, each sense amplifier being provided for a pair of odd and even column buses of the array. The array is laid out in rows and functional columns where a functional column consists of a pair of columns such that odd row cells are connected to the odd column of the pair and even row cells are connected to the even column of the pair.

The respective sense amplifiers are in the form of a cross coupled latch connected between a pair of column buses by source followers and leads from the latch drive write back gates coupled to each column bus so as to restore the cell that was accessed.

The interleaving of the cells, in this manner, eliminates unwanted differences due to unbalanced signal cross coupling, thus providing a truly data dependent differential signal to the terminals of the high impedance regenerative amplifiers. The nodes of the amplifier are disconnected from the sense lines or column buses, and hence are very low capacitance lines. In this manner, a decision as to the existence of a digital signal can be made very quickly.

While different embodiments of the present invention have been disclosed, it will be apparent to those skilled in the art that variations and modifications may be made therein without departing from the spirit and the scope of the invention as claimed.

What is claimed is:
1. A memory array comprising:
a plurality of single transistor dynamic memory cells;
a plurality of pairs of column conductors, each pair including an odd column conductor and an even column conductor;
a plurality of differential sense amplifiers each coupled between an odd column conductor and an even column conductor of one of said plurality of pairs of column conductors; and
a plurality of row conductors;
said array of transistor cells being arranged in rows and columns such that each cell in an odd row is coupled to a corresponding row conductor and to the odd column conductor of the corresponding pair of column conductors and each cell of an even row is coupled to the corresponding row conductor and to the even column conductor of the corresponding pair of column conductors;
each of said differential amplifiers providing to its respective pair of column conductors an inherent differential balance such that signals of very small amplitude can be detected from one or the other of said pair of column conductors according to whether an odd or even row cell is being accessed.
2. A memory array according to claim 1 wherein:
each transistor cell includes a transistor and a capacitance coupled in series.
3. A memory array according to claim 2 wherein:
each transistor is a field effect transistor.
4. A memory array according to claim 2 wherein:
each pair of column conductors is provided with a pair of dummy transistor cells each having a capacitance equal to one-half the capacitance of the other cells.
5. A memory array according to claim 4 wherein:
each dummy cell is provided with means to periodically recharge said dummy cell.
6. A memory array according to claim 5 wherein:
each pair of column conductors is provided with an input-output data exchange coupled to said pair at the end of said conductors opposite to the end to which said sense amplifier is coupled.

* * * * *

UNITED STATES PATENT OFFICE
CERTIFICATE OF CORRECTION

Patent No. 4,025,907　　　　　　　　　Dated May 24, 1977

Inventor(s) Joel A. Karp and John A. Reed

It is certified that error appears in the above-identified patent and that said Letters Patent are hereby corrected as shown below:

Col. 3, line 58, change "coefficient" to read --efficient--.

Signed and Sealed this twenty-third Day of August 1977

[SEAL]

Attest:

RUTH C. MASON
Attesting Officer

C. MARSHALL DANN
Commissioner of Patents and Trademarks